United States Patent
Moon et al.

(10) Patent No.: US 6,826,103 B2
(45) Date of Patent: Nov. 30, 2004

(54) AUTO-TUNEABLE REFERENCE CIRCUIT FOR FLASH EEPROM PRODUCTS

(75) Inventors: Nathan I. Moon, Austin, TX (US); Richard K. Eguchi, Austin, TX (US); Sung-Wei Lin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 10/284,061

(22) Filed: Oct. 30, 2002

(65) Prior Publication Data

US 2004/0085843 A1 May 6, 2004

(51) Int. Cl.$^7$ ................................................. G11C 7/02
(52) U.S. Cl. ............. 365/210; 365/189.07; 365/189.09; 365/185.21
(58) Field of Search ............................ 365/210, 189.07, 365/189.09, 185.21

(56) References Cited

U.S. PATENT DOCUMENTS

| | | | |
|---|---|---|---|
| 5,822,250 A | 10/1998 | Krzentz | ................ 365/185.29 |
| 6,058,066 A * | 5/2000 | Norris et al. | ........... 365/230.05 |
| 6,094,395 A * | 7/2000 | Weinfurtner | ................ 365/226 |
| 6,445,170 B1 * | 9/2002 | Pangal et al. | ................ 323/315 |
| 6,448,811 B1 * | 9/2002 | Narendra et al. | ............. 326/82 |
| 6,737,909 B2 * | 5/2004 | Jaussi et al. | ................ 327/541 |

* cited by examiner

*Primary Examiner*—Richard Elms
*Assistant Examiner*—Tuan T. Nguyen
(74) *Attorney, Agent, or Firm*—Fulbright & Jaworski, LLP

(57) ABSTRACT

Methods and apparatus for trimming a reference circuit. A representative technique includes transmitting a constant signal (e.g., a constant current or voltage). The constant signal is received (e.g., at a device pin or other contact). The constant signal is compared to a reference signal. Variables are obtained for program/erase pulses from a user. The reference circuit signal is adjusted to match the constant signal by sending program/erase pulses to the reference circuit. The program/erase pulses are set based on the variables for program/erase pulses and a result of comparing the constant signal with the reference signal.

15 Claims, 1 Drawing Sheet

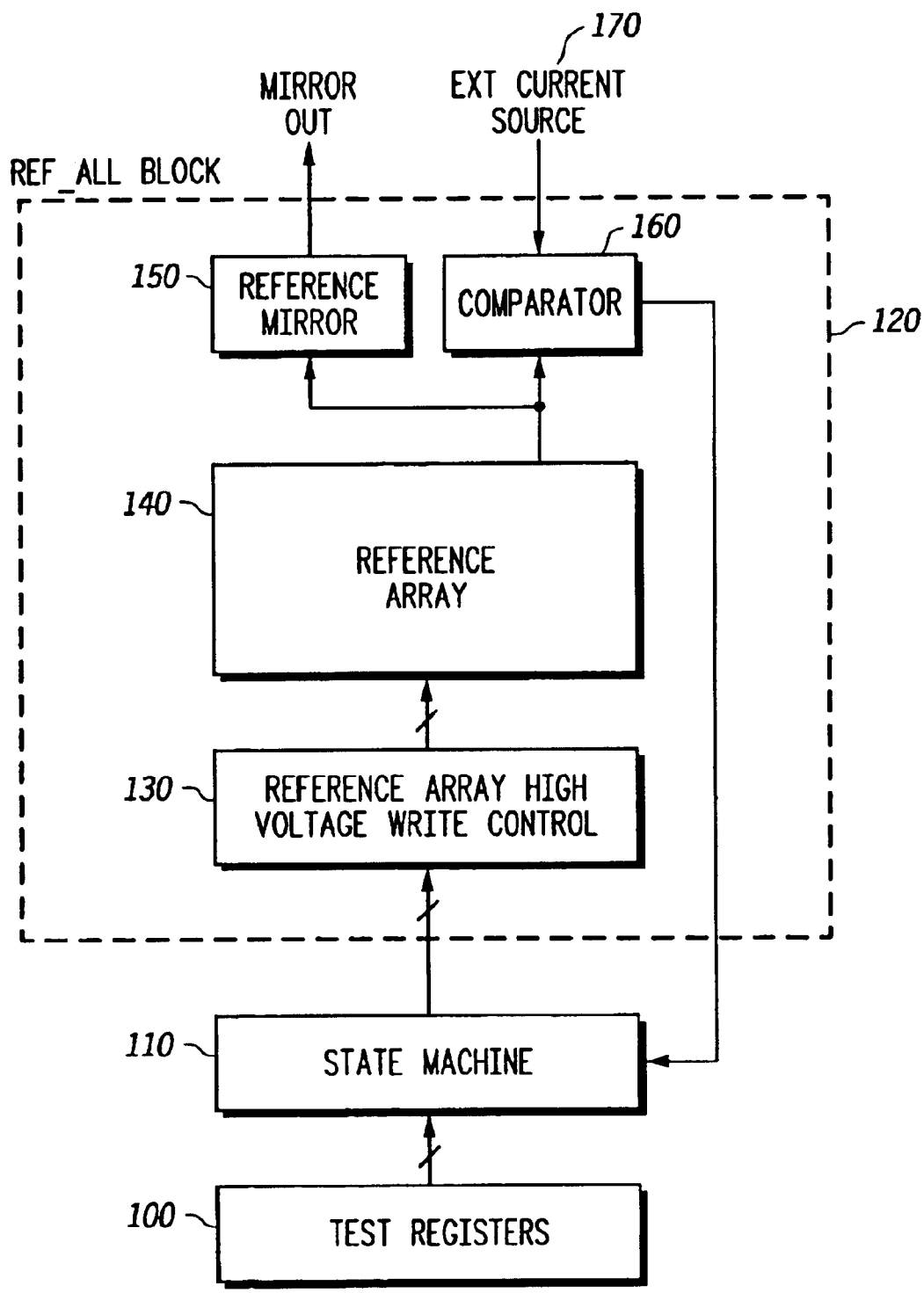
FIGURE

AUTO-TUNEABLE REFERENCE CIRCUIT FOR FLASH EEPROM PRODUCTS

BACKGROUND OF THE INVENTION

1. Field of the Invention

The invention relates generally to the field of nonvolatile memories (NVMs). More particularly, the invention relates to embedded NVMs. Specifically, a preferred implementation of the invention relates to trimming reference circuits for use in any NVM product, including stand alone and embedded NVMs.

2. Discussion of the Related Art

A reference circuit is typically used as a reference against which the performance of other circuits may be measured. In NVMs, the reference circuit typically needs to be calibrated to appropriate threshold voltages before it may be used.

Conventional embedded threshold voltage reference bits are typically trimmed to their desired value by a manual method. This manual method requires a tester for the chip first to program the bit, typically using an externally-timed program mode. The tester then reads the bit's threshold voltage using a threshold voltage read mode. If the threshold voltage is too high, the tester applies an erase pulse, typically using an externally-timed erase mode. The tester then continues the process of reading the threshold voltage and erasing until the threshold voltage reaches the desired value.

To test a flash EEPROM, a tester provides a constant current through a device pin, and logic external to the NVM module will trim the reference cells to the correct target voltage range, as determined by the manufacturer. For NVM products, a reference circuit must be trimmed to the correct threshold voltage such that all operations (read, program, erase, etc) work correctly. Current methodology requires the tester to measure current through a high precision Parametric Measurement Unit (PMU), make decisions on whether to apply program or erase pulses, and apply the program or erase pulses until the PMU measures a current within the target range.

Currently, automated flash EEPROM array reference circuit trimming utilizes complicated external voltage, current measurements, and timing control mechanisms that are supported by using production test platforms. The process requires synchronization of DUTs (Devices Under Test) that are being tested, which in itself utilizes complex control software that is run on intelligent test platforms. These intelligent test platforms may automate the process, but the platforms require complex hardware and software to use. They typically use high precision power supplies and PMUs. Due to the time needed to calibrate each reference circuit, this entire process results in long test times, long resolution times to synchronize high precision supplies and PMUs, and may only allow a limited number of DUTs to be tested in parallel due to tester hardware limitations in parts such as the power supplies and PMUs.

Accordingly, the need for a simple and inexpensive test and trim tool for NVM reference circuits has not been fully met. The current testing tools on the market require complex and expensive software and testing equipment and take a long time to accomplish their task, resulting in lost time. There is a need for a solution that will quickly and simply test and debug NVM reference circuits.

BRIEF DESCRIPTION OF THE DRAWINGS

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

The accompanying FIGURE is a block diagram representative of a hardware embodiment of the invention.

DETAILED DESCRIPTION

In general, the context of the invention can include an on-chip self trim circuit. The context of the invention can also include a flash EEPROM tester.

An embodiment of the present invention may be used in microcontrollers with embedded nonvolatile memories (NVMs) and stand alone nonvolatile memories. It may also be used with any type of trimmable reference device, including but not limited to a non Floating Gate type NVM cell (SONOS; silicon-oxide-nitride-oxide-semiconductor) which may require a fixed reference cell to improve a read disturb issue (a natural characteristic of the SONOS technology). It can be a cost effective solution for testing flash memory. A reference cell which is identical to the core cells is preferred as it will exhibit the same behavior as the core cells in regards to voltage, temperature, and frequency.

Trimming methods in use today require an intelligent test platform equipped with high precision power supplies and PMUs to perform the reference circuit trimming operation. An intelligent test platform is one that can control the reference test current/voltage and send commands to the chip being tested as changes are perceived to be necessary by the test platform.

Another method currently in use self trims the NVM reference cell by comparing a current to a current across a fixed reference resistor and trying to match the voltage across the reference resistor. Hardware variabilities and process variations make this method less accurate than the techniques described in the present disclosure.

In an embodiment of the invention, a tester provides a constant signal (e.g., a constant current or voltage) through a contact such as but not limited to a device pin (representing a much cheaper tester hardware requirement), and internal logic within the NVM module self-trims reference cells to the correct target range. This hardware design allows for flexibility in the design implementation to make this invention economically feasible. This embodiment allows for testing in low cost ranged test systems as reference circuit trimming are self contained within the DUT.

One embodiment of the invention is shown in the accompanying FIGURE. The FIGURE is a block diagram of a hardware implementation. It shows that test registers 100 are coupled to a state machine 110, which may be coupled to a grouping of logic and hardware elements called the ref_all block 120. This ref_all block 120 compares a test current with the current in the chip and trims the reference cells accordingly. This ref_all block 120 contains a "Reference Array High Voltage Write Control" block 130 that is coupled to a reference array 140. This reference array 140 is coupled to both a reference current mirror 150 and a comparator block 160. The comparator block 160 also receives input from an external current source. The reference current mirror 150 outputs to a receiving block that is outside of the ref_all block 120.

In this embodiment, an external current source 170 is applied to the ref_all block 120 through the comparator 160. The comparator 160 compares the external current with the current of the DUT reference circuit/array 140. The results of the comparison is transmitted to state machine 110. In a different embodiment, external current source 170 may actually be a voltage source (not illustrated as such). The external current source 170 may also be replaced by a band gap circuit (not illustrated) that is internal to the NVM.

The self trimming state machine 110 is unique in that it is programmable to tweak and optimize signal and transistor conditions as the silicon process is improved. (i.e. flow, bias conditions, pulse width, etc.) The state machine 110 receives inputs from the test registers 100 whose contents are input by the user. The contents of the test registers 100 may include variables for program/erase pulses/signals sent to the reference circuit/array 140 such as pulse width, bias conditions, and an algorithm which controls the program/erase signals. In a different embodiment, state machine 110 may be software or hardware, or it may be realized with a CPU, as is known in the art.

Based on the results from the comparator 160 and the user-input variables stored in the test registers 100, the state machine 110 instructs the "Reference Array High Voltage Write Control" module 130 to send program/erase pulses to the reference array 140. These pulses change the transistor characteristics of the DUT by changing the bias on the transistor, which in turn, changes the reference circuit voltage.

The current of the reference circuit/array 140 after the program/erase pulses have been applied is output to both the comparator 160 and a reference mirror 150 which outputs the current of the reference circuit/array 140. This current output by the reference mirror 150 may be used for transistor characterization purposes, i.e. IV curves.

One embodiment of the present invention, as applied to an EEPROM, is described as follows. A long erase pulse is applied to the EEPROM to erase a reference bit (refbit) below a target vt. Then, a program voltage is set in a test register, and a pulse width is set in a pulse width control register. The external reference current is then set, and the refbit is programmed by the external reference to match the external reference current.

A special self trimming reference circuit, an embodiment of the invention, may be embedded into a Flash EEPROM module, along with the reference circuit (cells). Where the reference cells are set and how they may be efficiently trimmed requires the use of characterization data on the actual reference module. This happens well after the final design of the reference module.

Embodiments of the invention (e.g., those utilizing a constant current through a device pin) advantageously allow one to meet an inexpensive tester-hardware requirement. Further, such embodiments provide for more robust trimming resolution and accuracy (e.g., for a NVM reference cell).

All timing sequences for timing the reference cells may be internally controlled by the circuit through synchronization and voltage switching by the program/erase pulses. Test time throughput is maximized by eliminating the overhead of tester/DUT handshaking for synchronization, current measurements and voltage.

The terms a or an, as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically.

All the disclosed embodiments of the invention disclosed herein can be made and used without undue experimentation in light of the disclosure. It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

We claim:

1. An on-chip apparatus for trimming a reference circuit, comprising:

an external signal source;

a plurality of registers;

a state machine coupled to the plurality of registers;

a reference circuit trimming module to receive input from the state machine and outputs to the reference circuit; and a comparator receiving signal input from the reference circuit and the external signal source.

2. The apparatus of claim 1, wherein the external signal source is a current source.

3. The apparatus of claim 2, further comprising a current mirror coupled to the reference circuit to output a current of the reference circuit.

4. The apparatus of claim 1, wherein the external signal source is a voltage source.

5. The apparatus of claim 4, further comprising a voltage mirror coupled to the reference circuit to output a voltage of the reference circuit.

6. The apparatus of claim 1, wherein the registers hold one or more variables input by a user.

7. The apparatus of claim 6, wherein the one or more variables include a pulse width variable, a bias condition variable, and a pulse control algorithm.

8. The apparatus of claim 1, wherein the reference circuit trimming module is a Reference Array High Voltage Write Control module.

9. The apparatus of claim 1, wherein the reference circuit trimming module outputs program/erase pulses to the reference circuit.

10. An on-chip apparatus for trimming a reference circuit, comprising:

a band gap circuit;

a plurality of registers;

a state machine coupled to the plurality of registers;

a reference circuit trimming module to receive input from the state machine and outputs to the reference circuit; and a comparator receiving signal input from the reference circuit and an external signal source.

11. The apparatus of claim 10, further comprising a voltage mirror coupled to the reference circuit to output a voltage of the reference circuit.

12. The apparatus of claim 10, wherein registers hold one or more variables input by a user.

13. The apparatus of claim 12, wherein the one or more variables include a pulse width variable, a bias condition variable, and a pulse control algorithm.

14. The apparatus of claim 10, wherein the reference circuit trimming module is a Reference Array High Voltage Write Control module.

15. The apparatus of claim 10, wherein the reference circuit trimming module outputs program/erase pulses to the reference circuit.

* * * * *